United States Patent
McCartney et al.

(10) Patent No.: US 11,621,624 B2
(45) Date of Patent: Apr. 4, 2023

(54) PHASE TRACKING IN AC POWER SYSTEMS USING COHERENT SAMPLING

(71) Applicant: Analog Devices International Unlimited Company, Limerick (IE)

(72) Inventors: Damien J. McCartney, Raheen (IE); Damien Murphy, Mallow (IE); Jeric Adrian Butiu Monzon, Biñan (PH)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/343,230

(22) Filed: Jun. 9, 2021

(65) Prior Publication Data
US 2021/0399648 A1 Dec. 23, 2021

Related U.S. Application Data (60) Provisional application No. 63/041,346, filed on Jun. 19, 2020.

(51) Int. Cl.
*H02M 1/00* (2006.01)
*H02M 7/48* (2007.01)

(52) U.S. Cl.
CPC ........... *H02M 1/0012* (2021.05); *H02M 7/48* (2013.01); *H02M 1/0025* (2021.05)

(58) Field of Classification Search
CPC ..... H02M 1/0012; H02M 1/0025; H02M 7/48
See application file for complete search history.

(56) References Cited

U.S. PATENT DOCUMENTS

| | | | |
|---|---|---|---|
| 7,259,547 B1 * | 8/2007 | Summers | G01R 21/133 324/141 |
| 10,097,200 B1 * | 10/2018 | Usach Merino | H03M 3/462 |

FOREIGN PATENT DOCUMENTS

WO  WO-2021255173 A1  12/2021

OTHER PUBLICATIONS

"International Application Serial No. PCT/EP2021/066417, International Search Report dated Sep. 27, 2021", 5 pgs.
"International Application Serial No. PCT/EP2021/066417, Written Opinion dated Sep. 27, 2021", 7 pgs.
O'Shaughnessy, Anthony, "Coherent Sampling for Power Quality Measurements Using the AD7779 24-Bit Simultaneous Sampling Sigma-Delta ADC", Analog Devices AN-1388 Application Note, (2016), 6 pgs.
Usman, Muhammad Usama, "Applications of synchrophasor technologies in power systems", Journal of Modern Power Systems and Clean Energy, vol. 7, No. 2, (Mar. 1, 2019), 211-226.
Van, Yang, "Coherent Sampling Solution for an Electric Power System", Texas Instruments Application Report, [Online] Retrieved from the Internet: <URL: https://e2echina.ti.com/cfs-file/key/telligent-evolution-components-attachments/13-109-00-00-00-00-77-10/Electric-Power-System-Coherent-Sampling.pdf>, (2012), 1-9.

* cited by examiner

*Primary Examiner* — Jue Zhang
(74) *Attorney, Agent, or Firm* — Schwegman Lundberg & Woessner, P.A.

(57) ABSTRACT

Embodiments of the present disclosure may monitor and adjust a sampling rate of an ADC for converting the power signal to a digital signal, locking onto the phase and frequency of the power signal. This technique may make the sampling process coherent relative to the power signal. Properties of the power signal, such as phase, frequency, and magnitude, may be extracted relative to an idealized power signal.

19 Claims, 8 Drawing Sheets

PHASE TRACKING IN AC POWER SYSTEMS USING COHERENT SAMPLING

CLAIMS OF PRIORITY

This patent application claims the benefit of priority U.S. Provisional Patent Application Ser. No. 63/041,346, titled "SYNCHROPHASOR MEASUREMENT IN POWER DISTRIBUTION SYSTEM," filed on Jun. 19, 2020, which is hereby incorporated by reference herein in its entirety.

TECHNICAL FIELD

The present disclosure generally relates to tracking phase properties in AC power distribution systems using coherent sampling.

BACKGROUND

Power distribution systems typically operate at a set frequency. For power grids in the United States of America, the frequency is set nominally at 60 Hz, and for certain parts of Europe, it is at 50 Hz. Although the grid typically can have uniformity across the grid, the grid frequency can drift from the ideal frequency, e.g., ±0.1 Hz. That is, the frequency sometimes can vary by time.

Some systems, such as those described in IEEE C.37.118.1, can use analog to digital converters (ADCs) to sample the power signal with timing based on absolute clock and calculate real and imaginary (D and Q) quadrature components. Hence, the ADC sampling rate can be fixed in this incoherent sampling scheme. However, this incoherent sampling scheme can yield ripples in the measured phasor frequency and magnitude because the actual power line frequency may deviate from the nominal frequency.

BRIEF DESCRIPTION OF THE DRAWINGS

Various ones of the appended drawings merely illustrate example embodiments of the present disclosure and should not be considered as limiting its scope.

DETAILED DESCRIPTION

The present inventors recognized, among other things, a need for more accurate techniques for tracking power signals in power distribution systems. Embodiments of the present disclosure may monitor and adjust a sampling rate of an ADC for converting the power signal to a digital signal, locking onto the phase and frequency of the power signal. This technique may make the sampling process coherent relative to the power signal. Coherent sampling corresponds to an integral number of ADC samples taken over an integral number of cycles of the signal. Properties of the power signal, such as phase, frequency, and magnitude, may be extracted relative to an idealized power signal to generate synchrophasors, which are time-synchronized measurements of both angle and magnitude. Embodiments of the present disclosure may also generate reference timing instants, for example once per cycle, from an absolute time signal.

This document describes circuit to track properties of a power signal. The circuit may include an analog-to-digital converter (ADC) to receive the power signal and to convert the power signal to a digital data signal and to generate a data ready signal. The circuit may also include a counter to increment a count based on occurrences of a data ready signal of the ADC and to generate a phase output associated with the power signal. The circuit may further include a phase locked loop (PLL) to adjust a sampling rate of the ADC based on the digital data signal and the count.

This document also describes a method to monitor a power signal, the method comprising: converting a power signal to a digital data signal using an ADC; generating a data ready signal associated with the ADC; counting occurrences of the data ready signal and generating a phase output associated with the power signal based on the counted occurrences; and adjusting a sampling rate of the ADC to coherently sample the power signal based on the digital data signal and the counted occurrences.

This document further describes synchrophasor measurement system. The system may include a coherent sampling ADC to receive a power signal and to convert the power signal to a digital data signal and to generate a data ready signal, wherein a sampling rate of the ADC is based on a count of the data ready signal. They system may also include a digital engine to receive the digital data signal and data ready signal and generate phase, D, and Q outputs associated with the power signal. The system further includes a synchrophasor generator to generate a synchrophasor output based on the phase, D, and Q outputs associated with the power signal and a reference timing signal.

Figure 1:
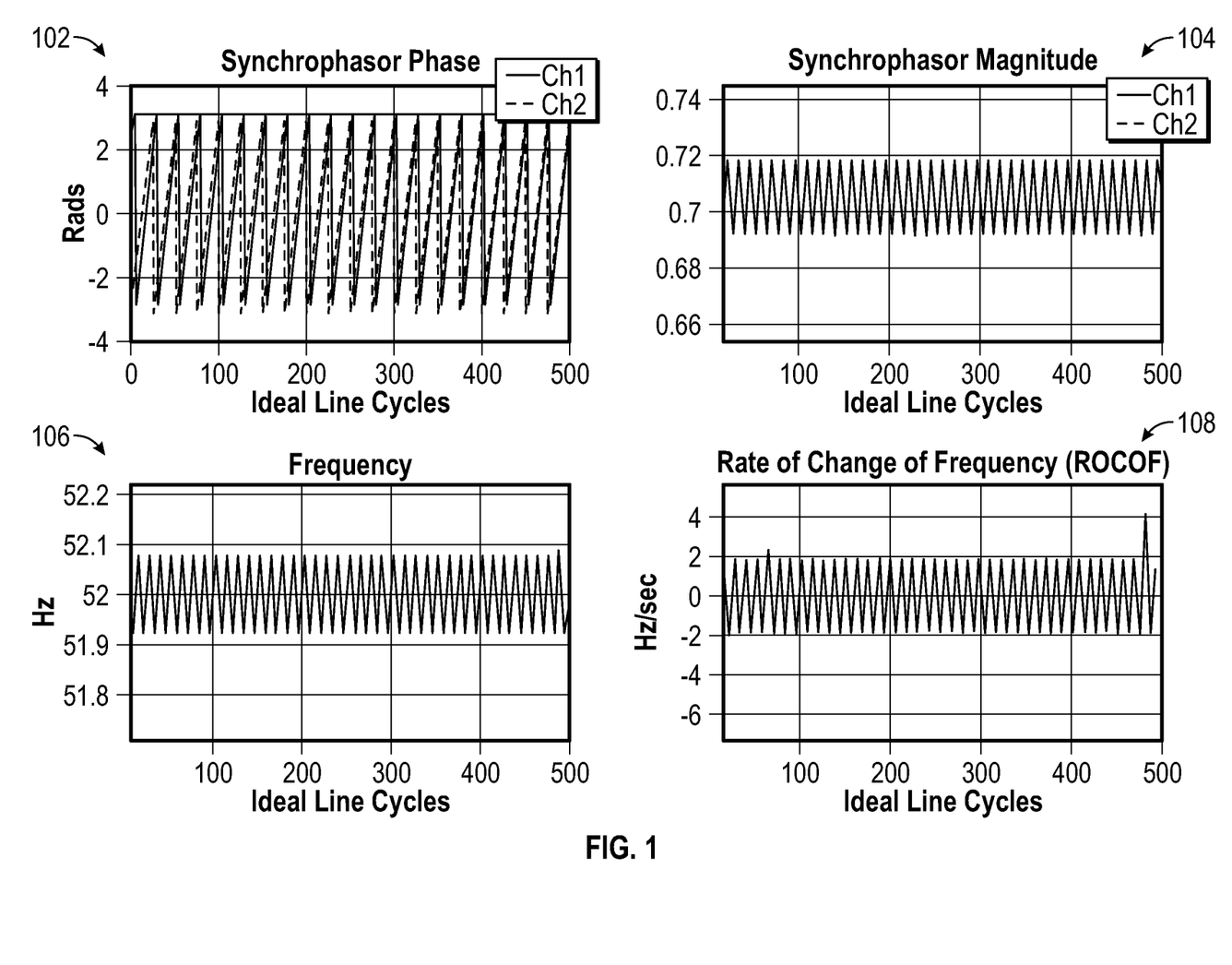
FIG. 1 illustrates an example of the waveforms generated using an incoherent sampling scheme.

FIG. 1 illustrates an example of the waveforms generated using an incoherent sampling scheme. Graph 102 shows a phase relationship of two channels (Channels 1 and 2). Graph 104 shows magnitude relationship of the two channels. Graph 106 shows a frequency response and graph 108 shows a rate of change of frequency. As shown, phase, frequency, and magnitude of the detected signal can fluctuate. This fluctuation can be undesired and cause issues. Filtering is typically not a suitable solution because filtering can increase settling time, leading to slow response time.

Figure 2:
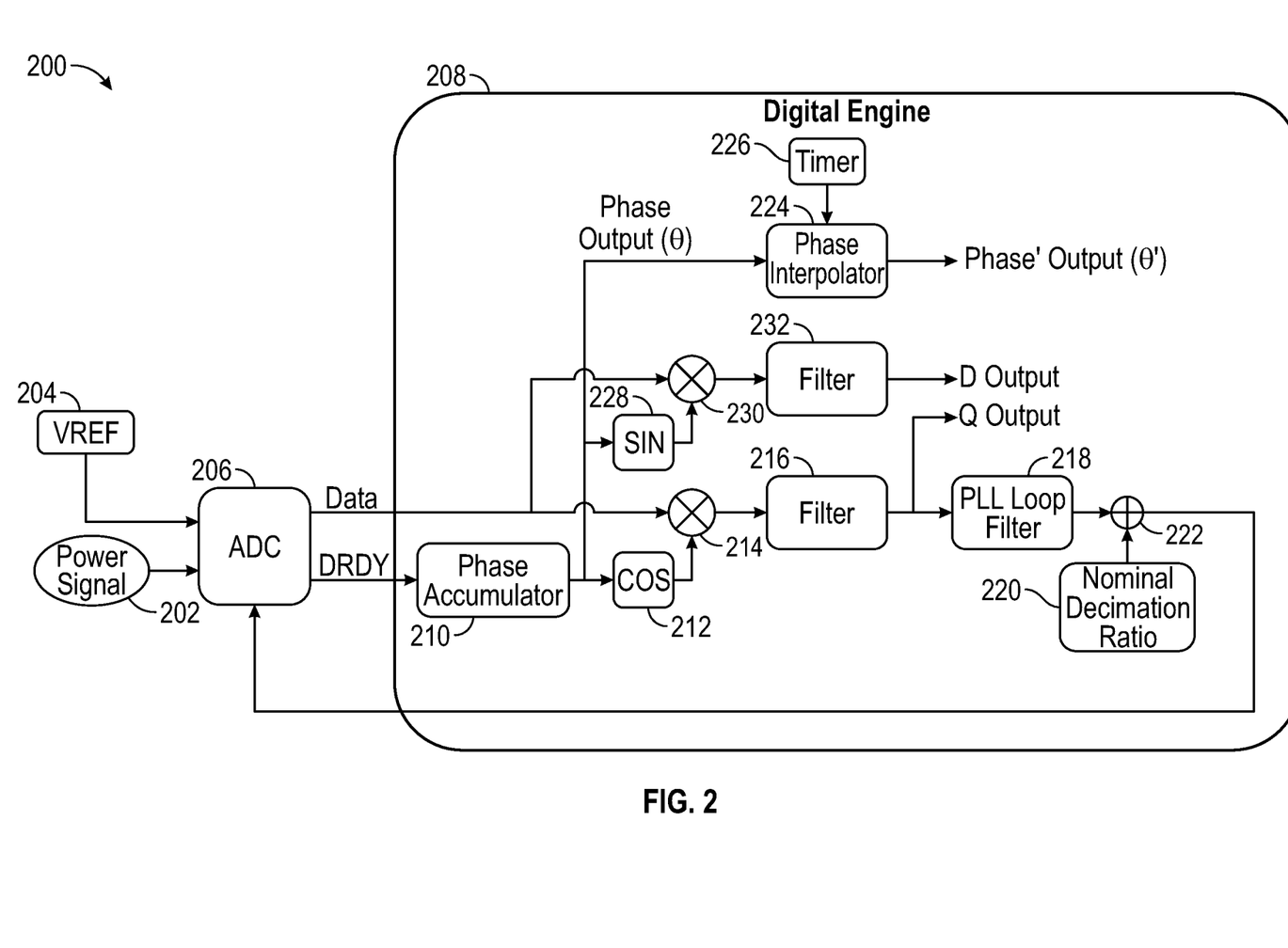
FIG. 2 illustrates a block diagram of a coherent sampling ADC system.

FIG. 2 illustrates a block diagram of an example portion of a coherent sampling ADC system 200. The system 200 may use a phase lock loop (PLL) to track the power signal and adjust the sampling frequency for coherent sampling. Coherent sampling corresponds to an integral number of ADC samples taken over an integral number of cycles of the signal. The system 200 may include a power signal 202, a reference voltage 204, an ADC 206, and a digital engine 208. The power signal 202 may be non-ideal in this example: ~50.1 Hz, instead of the ideal 50 Hz. The reference voltage 204 may provide a reference potential for the ADC 206. The ADC 206 may be provided as a sigma delta converter. The ADC 206 may convert the power signal into a digital signal (Data) and may generate a data ready (DRDY) signal.

The digital engine 208 may receive the converted digital data and DRDY signals. The digital engine 208 may track the power signal 202 based on the Data and DRDY signals, and may adjust the sampling frequency of the ADC 206 for coherent sampling. The digital engine 208 may be provided as a microcontroller, a microprocessor, a FPGA, or other suitable digital components. The digital engine 208 may include a phase accumulator 210, a cosine wave generator 212, a first multiplier 214, a first filter 216, a PLL loop filter (loop filter) 218, a nominal decimation ratio variable 220, a digital adder 222, a phase interpolator 224, a timer 226, a sine wave generator 228, a second multiplier 230, and a second filter 232.

The phase accumulator 210 may be provided as a sample counter. The phase accumulator 210 may receive the DRDY signal from the ADC 206. The phase accumulator 210 may generate a count of occurrences of the DRDY signal, which may be indicative of the phase of the Data signal. The count may also be provided as a phase output (θ) of the system 200.

In an embodiment, a sample counter and a sin/cos look-up table (LUT) may be implemented. For N samples per power line cycle (e.g., N=80), the sample counter may run from 0 to N−1. If n is the current value of this counter, it may be used as the input to the look up tables to generate the sin/cos values. In the phase interpolator 224 (discussed below), the integer n may be used to calculate the phase at the last DRDY, namely $2\pi*n/N$—the integer part of the phase. As discussed below, the timing data from timer 226 may be used to calculate at what point in the sample interval the reference timing instant has occurred. This fraction may be denoted as m, where m may correspond to timer @reference-timer@DRDY)/(average of timer difference between consecutive DRDYs). The fractional part of the phase is thus $2\pi*m/N$ which may be added to the integer part to generate the synchrophasor phase.

In another embodiment, the phase accumulator 210 may be implemented to increment by $2\pi/N$ every DRDY and thus having the value $2\pi*n/N$ at n samples into the cycle. Here, direct sine and cos of the phase accumulator count may be taken without using a lookup table.

The cosine wave generator 212 may generate a cosine wave based on the output of the phase accumulator 210. The first multiplier 214 may receive the generated cosine wave and the Data signal, and may multiply the cosine wave and the Data signal.

The filter 216 may receive the multiplied signal from the multiplier 214. The filter 216 may be provided as a full cycle filter (e.g., average of N inputs (e.g., N=80)). Based on the multiplied signal, the filter 216 may generate a Q output of the system 200.

In another embodiment, the filter 216 may be provided as a half cycle filter (e.g., average of 40 inputs) or another value. Additionally or alternatively, the filter 216 may be provided as other types of digital low pass filters.

The Q output from filter 216 may also be inputted into the PLL loop filter 218. The nominal decimation ratio variable 220 may relate the nominal power line frequency to the desired ADC sample rate (e.g., 512). The digital adder 222 may add the output of the PLL loop filter and the nominal decimation ratio.

The output of the adder 222 may then update the decimation registers of the ADC 206. This update may be made once or twice per line cycle. The sampling rate of the ADC may be adjusted based on the updated decimation registers. The adjusted sampling rate may alter the phase or time increment of subsequent output samples. This update may implement coherent sampling. ADC 206 may be provided as a high-resolution sigma-delta ADC having a high-resolution control of decimation ratios and composed of integer and fractional components. This may allow the high-resolution sigma-delta ADC to accurately alter its sampling instants as described herein.

The output of the phase accumulator 210 (e.g., a count of occurrences of the DRDY signal) may also be received by the phase interpolator 224. The phase interpolator 224 may also be coupled to the timer 226. The phase interpolator 224 may generate an interpolated phase output (phase 'output or θ') of the power signal 202 based on the count of the phase accumulator 210 and timing information from the timer 226. In an embodiment, the timer 226 may run free and may be read every DRDY. This may indicate the average timer count per sample interval. As discussed below, the timer 226 may also be read when the reference timing instant arrives. By taking the difference from the reading at the previous DRDY, an indication of how far through the sample interval may be determined. This difference may be divided by the average timer counter per sample interval to obtain the fraction of $2n/N$, which may be added to $2\pi*n/N$ to calculate the synchrophasor phase. The timer may generate an interrupt in an embodiment.

The output of the phase accumulator 210 (e.g., a count of occurrences of the DRDY signal) may also be received by the sine wave generator 228. The sine wave generator 228 may generate a sine wave based on the output of the phase accumulator 210. The second multiplier 230 may receive the generated sine wave and the Data signal, and may multiply the sine wave and the Data signal. In an embodiment, sine wave generator 228 and cosine wave generator 212 may be interchanged.

The filter 232 may receive the multiplied signal from the multiplier 230. The filter 232 may be provided as a full cycle filter (e.g., average of N inputs). Based on the multiplied signal, the filter 232 may generate a D output of the system 200.

In another embodiment, the filter 232 may be provided as a half cycle filter (e.g., average of N/2 inputs) or another value. Additionally or alternatively, the filter 232 may be provided as other types of digital low pass filters. In one example, filter 216 may be provided as a half cycle filter while filter 232 may be provided as a full cycle filter.

The system 200 may generate Phase θ (and Phase 'θ'), D, and Q outputs, representing the power signal characteristics. These outputs may then be used to generate synchrophasor of the power signal based on an ideal power signal (e.g., 50 Hz signal). A synchrophasor is a phasor representation of a measured signal. The outputs may be read at the ideal 50 Hz instants to generate the synchrophasor. This technique may generate an accurate measurement without substantial ripples.

Figure 3:
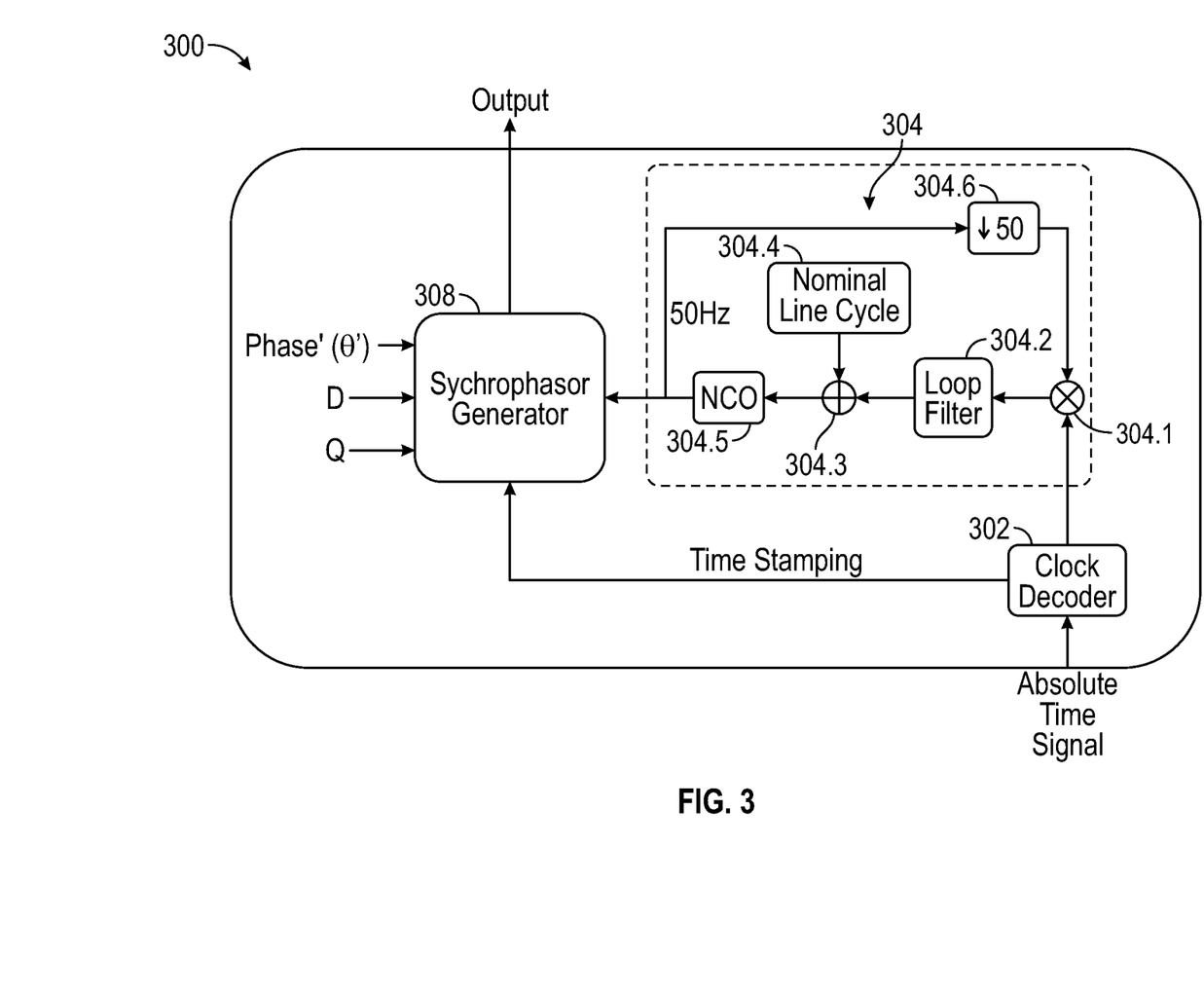
FIG. 3 illustrates a block diagram a reference timing signal generator and synchrophasor measurement system.

FIG. 3 illustrates a block diagram of example portions of a reference timing signal generator and synchrophasor measurement system 300. The system 300 may generate reference timing instants of an ideal power signal (e.g., 50 Hz) from an absolute time, such as a UTC clock signal distributed by a GPS receiver. The reference timing instants may be used to generate a synchrophasor of the input power signal using the outputs (Interpolated Phase', D, and Q outputs) discussed above in reference to FIG. 2, and the system 300 may use a second PLL to generate the reference timing instants. The system may include a clock decoder 302, a PLL 304, and a synchrophasor generator 308.

The clock decoder 302 may receive an absolute time signal, e.g., from 1 HZ IRIG-B (Inter-range instrumentation group) source. The clock decoder 302 may generate a time stamp based on the absolute time signal, which may be sent to synchrophasor generator 306. The output of the clock decoder 302 may be inputted to the PLL 304 (e.g., second PLL in addition to the first PLL in FIG. 2) to generate the reference timing instants. In this example, the timing instants are for a 50 Hz signal. The PLL 304 may include a phase detector (e.g., multiplier) 304.1, a loop filter 304.2, a digital adder 304.3, a nominal line cycle component 304.4, a numerically controlled oscillator (NCO) 304.5, and a clock divider 304.6. The NCO 304.5 may generate the reference timing instants.

The synchrophasor generator 306 may receive outputs, e.g., the Interpolated Phase', D, and Q outputs, of the coherent sampling ADC system 200 of FIG. 2 described above. Based on the outputs, the synchrophasor generator 306 may generate synchrophasor outputs using the reference timing instants received from the PLL 304 (e.g., NCO 304.5). The synchrophasor outputs may also be time stamped.

Figure 4:
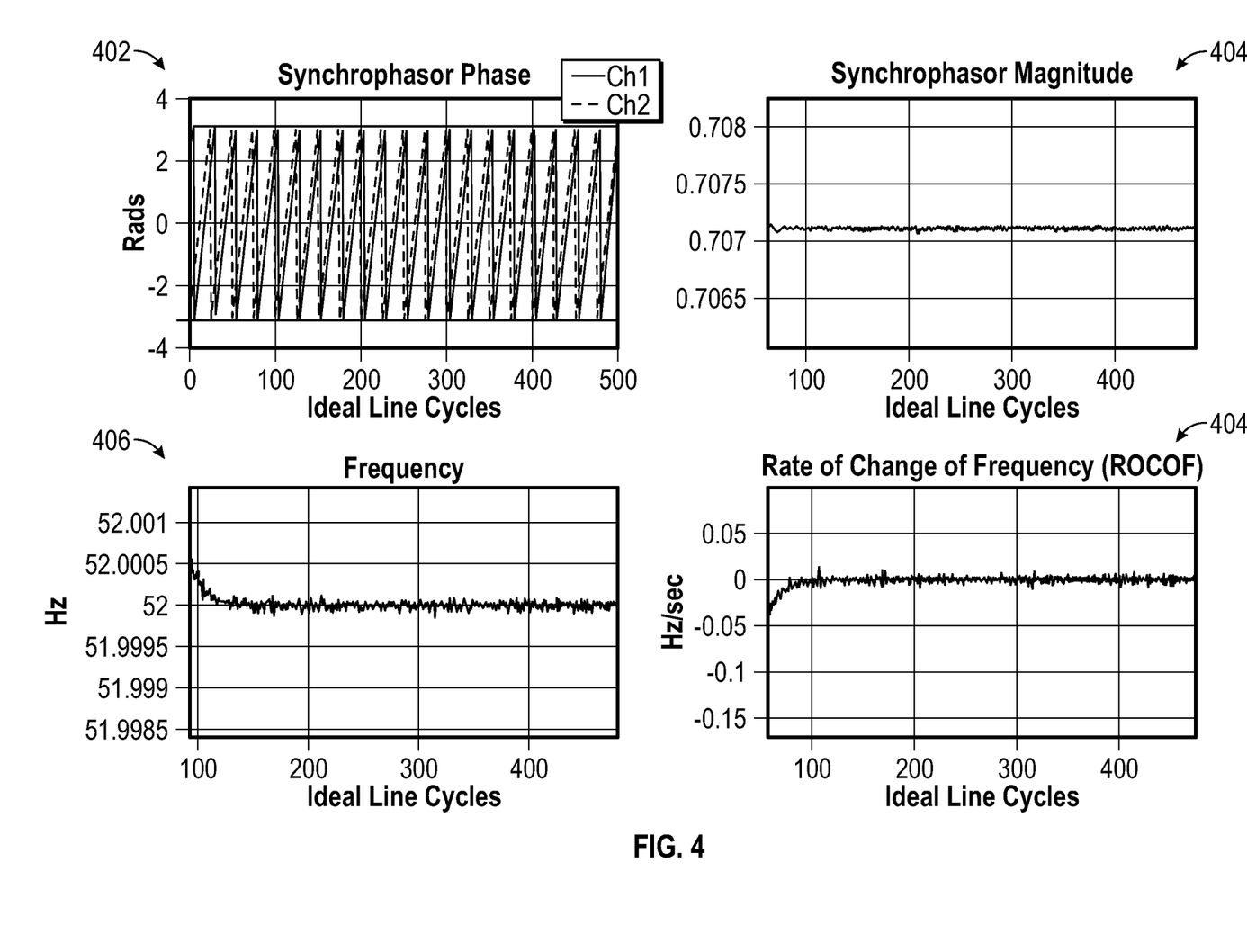
FIG. 4 illustrates example synchrophasor measurements.

FIG. 4 illustrates example synchrophasor measurements associated with the systems of FIGS. 2 and 3. Graph 402 shows a phase relationship of two channels (Channels 1 and 2). Graph 404 shows magnitude relationship of the two channels. Graph 406 shows a frequency response and graph 408 shows a rate of change of frequency. As shown in these graphs, the frequency of the synchrophasor is substantially stable. The frequency plot in graph 406 is the derivative of the synchrophasor phase signal. And the rate of change of frequency (ROCOF) is the derivative of the frequency plot (or second derivative of the phase). Moreover, as shown, the synchrophasor magnitude may also be substantially stable.

Figure 5:
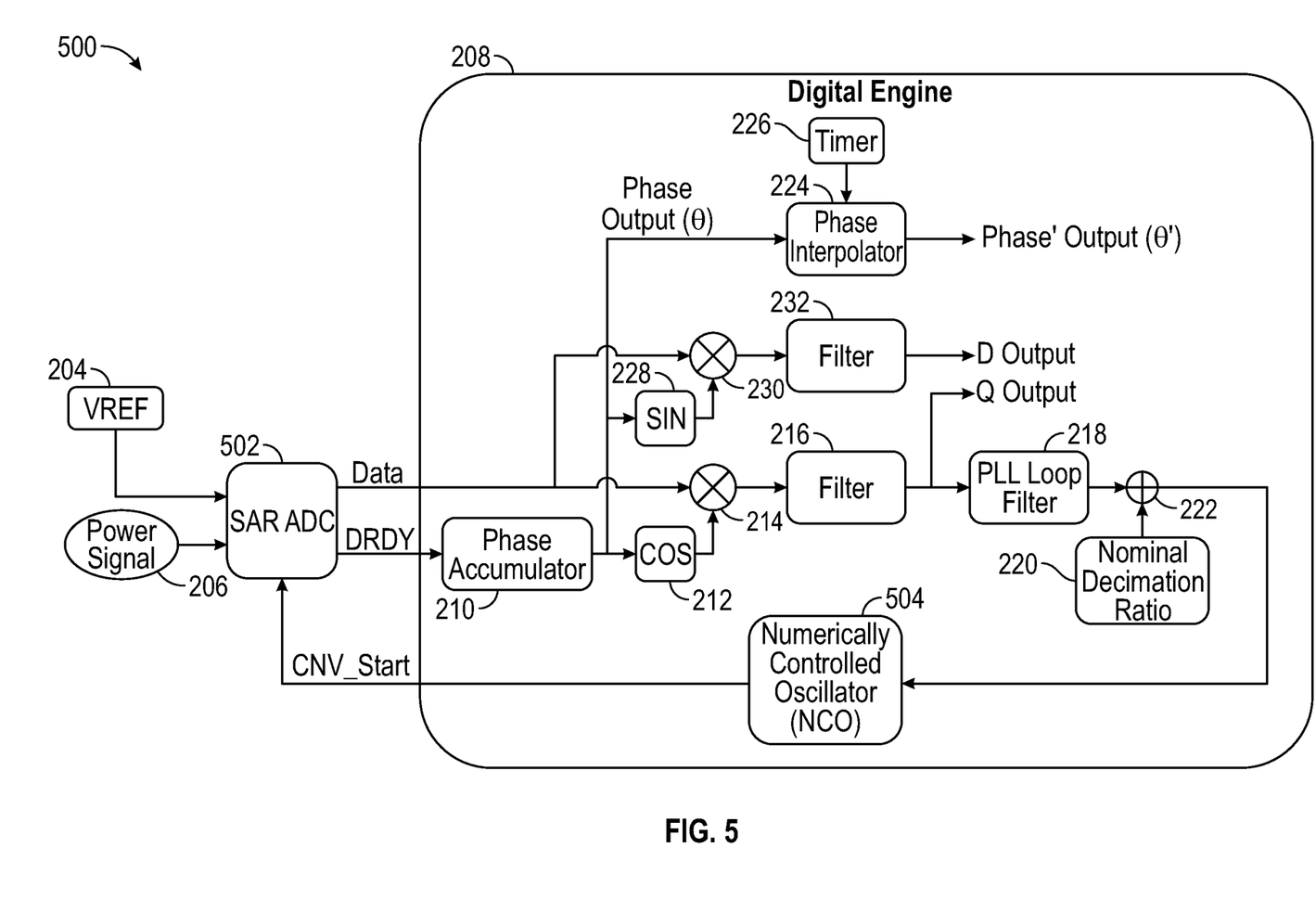
FIG. 5 illustrates a block diagram of a coherent sampling ADC system.

The coherent sampling techniques described may be used with different types of ADCs, such as a successive-approximation register (SAR) ADC. FIG. 5 illustrates a block diagram of example portions of a coherent sampling ADC system 500. The system 500 may be substantially similar to that of the coherent sampling system 200 described above with reference to FIG. 2 except for the use of a SAR ADC. In system 500, a SAR ADC 502 may be used to convert the power signal into a digital signal (Data) and may generate a data ready (DRDY) signal. Consequently, a NCO 504 may be placed in the PLL to generate a conversion start time (CNV_START) for the SAR ADC 502. The conversion start time may be modified using the techniques based on the data and data ready signals described above with reference to FIG. 2. The conversion start time may in turn adjust the sampling frequency of the SAR ADC 502 to implement coherent sampling.

Figure 6:
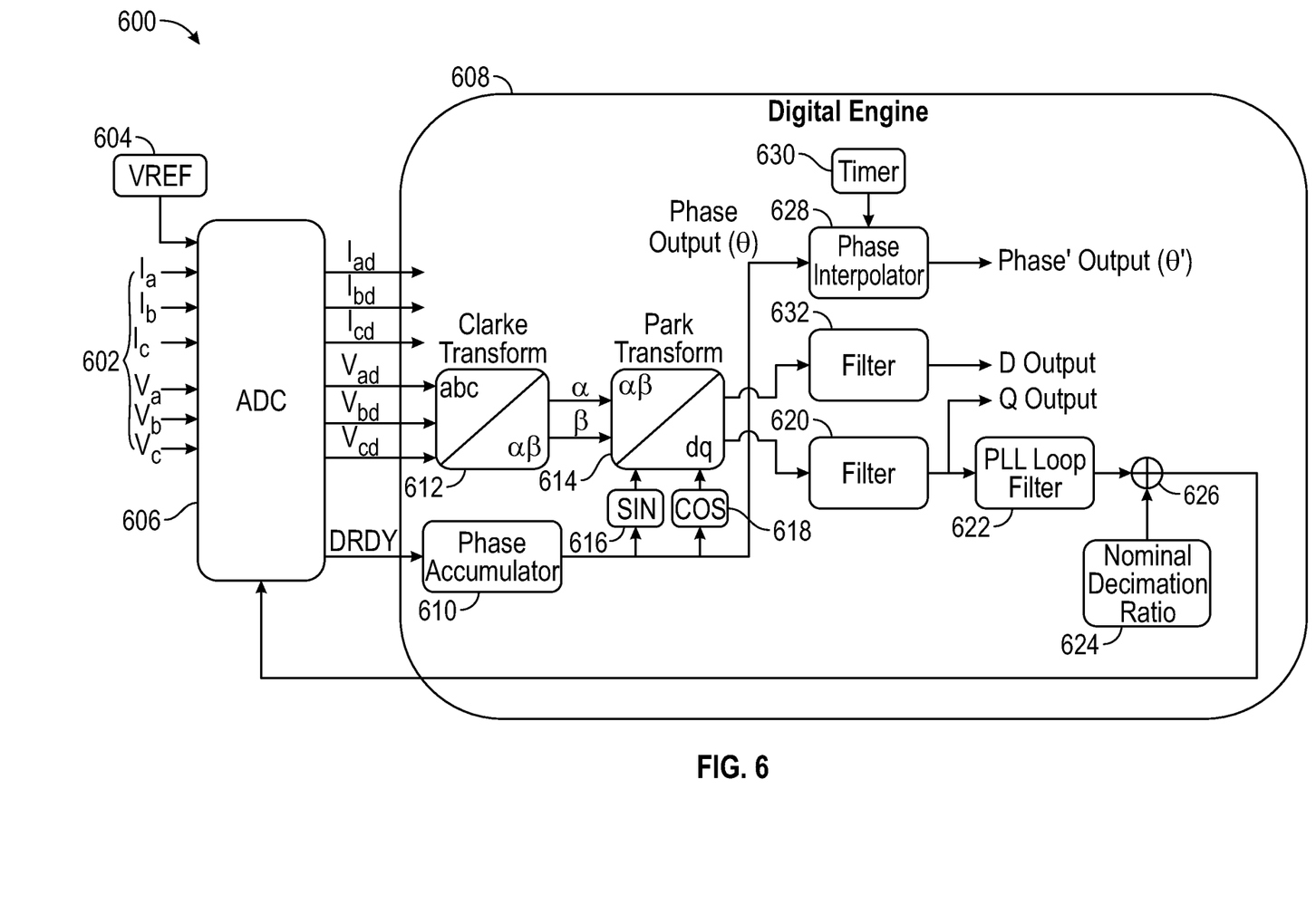
FIG. 6 illustrates a block diagram of a coherent sampling ADC system for a multi-phase power signal.

Moreover, the coherent sampling techniques described herein may be extended to multi-phase power distribution systems. FIG. 6 illustrates a block diagram of example portions of a coherent sampling ADC system 600 for a multi-phase power signal. The input power signal may include multiphase voltage and current components. The system 600 may use a PLL to track the voltage of the power signal to adjust the sampling frequency for coherent sampling, and the same sampling timing is used for the current components for coherent sampling.

The system 600 may include a power signal 602, a reference voltage 604, a multi-channel ADC 606, and a digital engine 608. The power signal 602 may be represented by the multiphase voltage ($V_a$, $V_b$, $V_c$) and current components ($I_a$, $I_b$, $I_c$). The reference voltage 604 may provide a reference potential for the ADC 606. The ADC 606 may be provided as a sigma delta converter, a SAR ADC, or other suitable ADC architecture. The ADC 606 may convert the power signal into digital representations of the multiphase components ($V_{ad}$, $V_{bd}$, $V_{cd}$) and may generate a data ready (DRDY) signal.

The digital engine 608 may receive the converted digital data and DRDY signals. The digital engine 608 may track the power signal 202 based on the Data and DRDY signals, and may adjust the sampling frequency of the ADC 206 for coherent sampling. The digital engine 608 may be provided as a microcontroller, a microprocessor, a FPGA, or other suitable digital components. The digital engine 608 may include a phase accumulator 610, a Clarke transform generator 612, a Park transform generator 614, a cosine wave generator 616, a sine wave generator 618, a first filter 620, a PLL filter 622, a nominal decimation ratio variable 624, a digital adder 626, a phase interpolator 628, a timer 630, and a second filter 632.

The phase accumulator 610 may be provided as a sample counter, as described above with reference to phase accumulator 210 of FIG. 2. The phase accumulator 610 may receive the DRDY signal from the ADC 606. The phase accumulator 610 may generate a count of occurrences of the DRDY signal, which may be indicative of the phase of the Data signal. The count may also be provided as a phase output ($\theta$) of the system 600 may be transformed to phase by $2\pi/N$.

The Clarke transform generator 612 may receive multiphase components ($V_{ad}$, $V_{bd}$, $V_{cd}$) and convert them to a and 6 values in an orthogonal stationary frame. The a and B values may be inputted into the Park transform generator 614.

The cosine wave generator 616 may generate a cosine wave based on the output of the phase accumulator 610, and the sine wave generator 618 may generate a sine wave based on the output of the phase accumulator 610. These cosine and sine waves may be provided as an input to the Park transform generator 614.

The Park transform generator 614 may convert the a and 0 values to an orthogonal reference frame (D and Q). The filter 620 may receive the output from the Park transform generator 614 and may generate a Q output of the system 600. The filter 620 may be provided as a full cycle filter (e.g., average of 80 inputs).

In another embodiment, the filter 620 may be provided as a half cycle filter (e.g., average of 40 inputs) or another value. Additionally or alternatively, the filter 620 may be provided as other types of digital low pass filters.

The Q output from filter 620 may also be inputted into the PLL loop filter 622. The nominal decimation ratio variable 624 may relate the nominal power line frequency to the desired ADC sample rate (e.g., 512). The digital adder 624 may add the output of the PLL loop filter and the nominal decimation ratio.

The output of the adder may then update the decimation registers of the ADC 606. This update may be made once or twice per line cycle. The sampling rate of the ADC may be adjusted based on the updated decimation registers. The adjusted sampling rate may be applied to the phase or time increment of subsequent output samples. This update may implement coherent sampling. In the example where ADC 606 is implemented as a SAR ADC, a NCO may be used in the PLL to adjust a conversion start time of the ADC, as described herein.

The output of the phase accumulator 610 (e.g., a count of occurrences of the DRDY signal) may also be received by the phase interpolator 628. The phase interpolator 628 may also be coupled to the timer 630. The phase interpolator 628 may generate a phase output of the power signal 602 based on the count of the phase accumulator 610 and timing information from the timer 630. In an embodiment, the timer 630 may run free and may be read every DRDY. This may indicate the average timer count per sample interval. As discussed herein, the timer 630 may also be read when reference timing instant arrives. By taking the difference from the reading at the previous DRDY, an indication of how far through the sample interval may be determined. This difference may be divided by the average timer count per sample interval to obtain the fraction of $2\pi/N$, which may be added to $2\pi*n/N$ to calculate the synchrophasor phase. The timer may generate an interrupt in an embodiment.

The filter 632 may also receive the output of the Park transform generator 614 and may generate a D output of the system 600. The filter 632 may be provided as a full cycle filter (e.g., average of 80 inputs). In another embodiment, the filter 632 may be provided as a half cycle filter (e.g., average of 40 inputs) or another value. Additionally or alternatively, the filter 632 may be provided as other types of digital low pass filters. The system 600 may generate Phase (and Interpolated Phase'), D, and Q outputs, representing the signal characteristics of the multi-phase power signal, as described herein.

Figure 7:
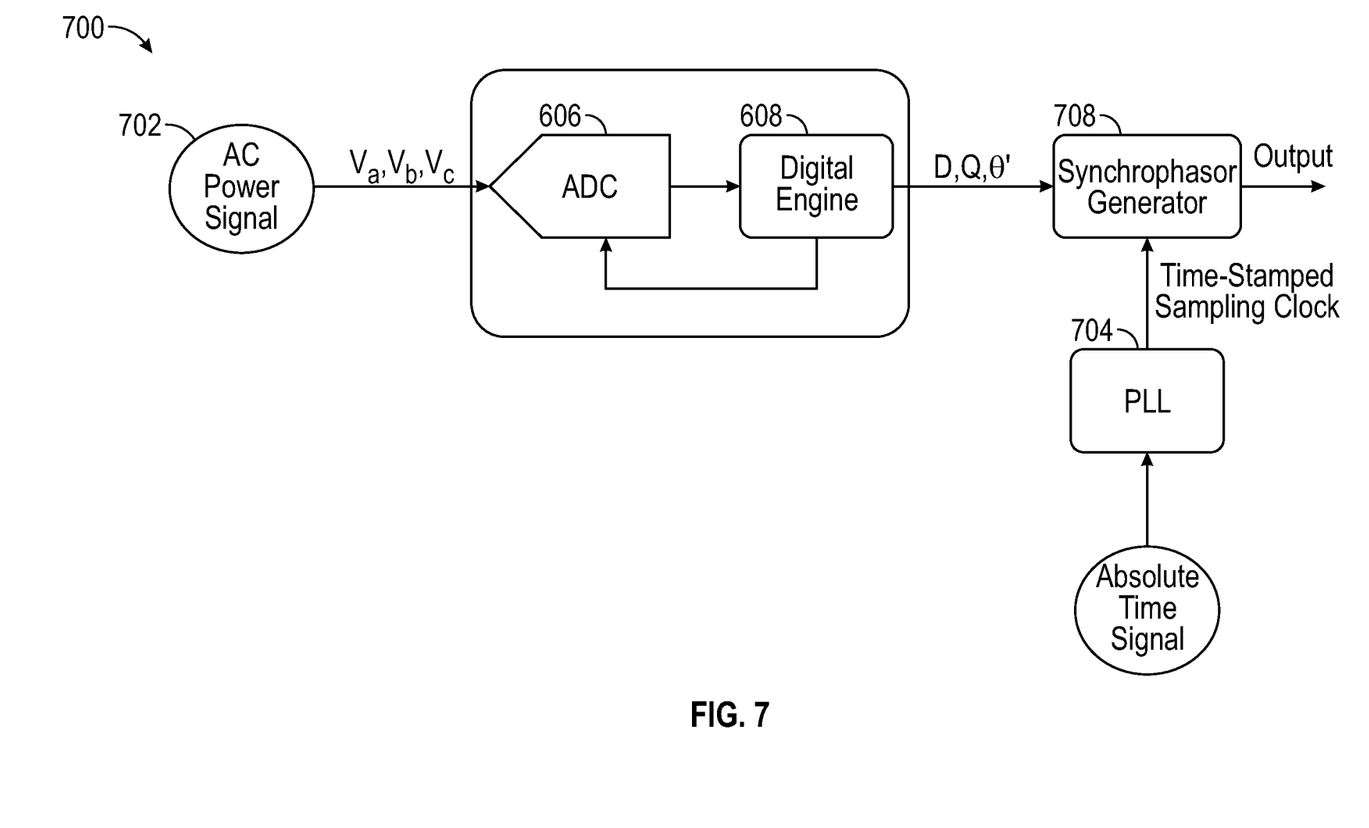
FIG. 7 illustrates a block diagram of a reference timing signal and synchrophasor measurement system for a multi-phase power signal.

FIG. 7 illustrates a block diagram of example portions of a reference timing signal generator and synchrophasor measurement system 700 for a multi-phase power signal. Similar to the system 300 described above with reference to FIG. 3, the system 700 may generate reference timing instants of an ideal power signal (e.g., 50 Hz) from an absolute time. The reference timing instants may be used to generate a synchrophasor of the input power signal using the outputs (Interpolated Phase', D, and Q outputs) discussed above in reference to FIG. 6, and the system 700 may use a second PLL to generate the reference power timing instants. The system 700 may include a power signal 702, the ADC 606 and digital engine 608 as described above with reference to FIG. 6, a PLL 704, and a synchrophasor generator 708.

As described above with reference to FIG. 3, the synchrophasor generator 706 may receive outputs, e.g., the Interpolated Phase', D, and Q outputs, of the coherent sampling ADC system 600 of FIG. 6 described above. Based on the outputs, the synchrophasor generator 706 may generate synchrophasor outputs using the reference timing instants received from the PLL 704. The synchrophasor outputs may also be time stamped.

The coherent sampling techniques described herein may be applied to renewable energy source feeding into power grids. To connect a renewable energy source (e.g., energy generated from solar panels), the power signal may need to be synchronized to the power grid. Thus, the coherent sampling techniques may be used with renewable inverter control systems.

Figure 8:
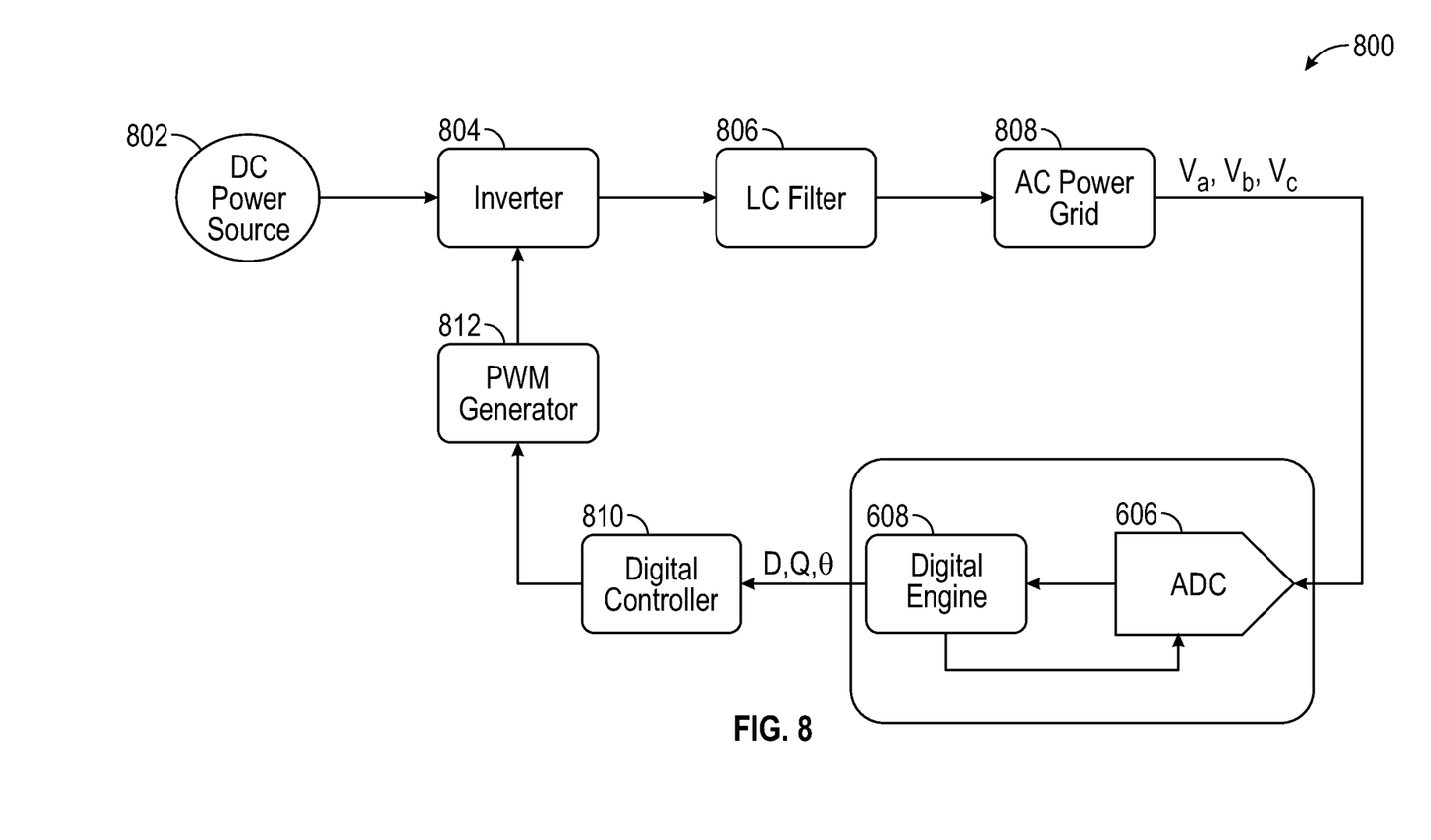
FIG. 8 illustrate a block diagram of an inverter system with tracking for a multi-phase power signal.

FIG. 8 illustrates a block diagram of example portions of an inverter system 800 with tracking for a multi-phase power signal. The inverter system 800 may include a DC power source 802, an inverter 804, a LC filter 806, an AC power grid 808 with a power signal ($V_a$, $V_b$, $V_c$), the ADC 606 and digital engine 608 as described above with reference to FIG. 6, a digital controller 810, and PWM generator 812. The PWM generator 812 may generate pulse width modulated signals for control of power switches of the inverter 804. Here, power from the DC power source 802 is coupled to the AC power grid 808 in a synchronized fashion using the tracking techniques described herein. The power signal from the AC power grid 808 is coherently sampled by the ADC 606 and the properties of the power signal (D, Q, $\theta$) are tracked. Based on these tracked properties, the digital controller 810 and PWM generator 812 may couple the DC power signal from the DC power source 802 to the AC power grid 808 using the inverter 804 in a synchronized manner. The inverted DC power signal may then be filtered by the LC filter 806 and fed into the AC power grid 808.

Various Notes

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific implementations in which the invention can be practiced. These implementations are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other implementations can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed implementation. Thus, the following claims are hereby incorporated into the Detailed Description as examples or implementations, with each claim standing on its own as a separate implementation, and it is contemplated that such implementations can be combined with each other in various combinations or permutations. The scope of the invention should be determined with reference to the appended claims, along with the full scope of equivalents to which such claims are entitled.

What is claimed is:

1. A circuit to track properties of a power signal, the circuit comprising:
    an analog-to-digital converter (ADC) to receive the power signal and to convert the power signal to a digital data signal and to generate a data ready signal;
    a counter to increment a count based on occurrences of a data ready signal of the ADC and to generate a phase output associated with the power signal; and
    a phase locked loop (PLL) to adjust a sampling rate of the ADC based on the digital data signal and the count.

2. The circuit of claim 1, further comprising:
    an interpolator to generate an interpolated phase output associated with the power signal based on the count.

3. The circuit of claim 1, further comprising:
    a wave generator to generate a wave based on the count;
    a multiplier to multiply the digital data signal with the wave; and
    a first filter to filter the output of the multiplier to generate a Q output associated with the power signal.

4. The circuit of claim 3, further comprising:
    a multiplier to multiply the digital data signal with a another wave based on the count;
    a second filter to filter an output of the multiplier and to generate a D output associated the power signal.

5. The circuit of claim 4, wherein first filter is a half-cycle filter and the second filter is a full-cycle filter.

6. The circuit of claim 1, further comprising:
    a synchrophasor generator to receive the phase output and D and Q outputs associated with the power signal and to generate a synchrophasor of the power signal based on the phase, D, and Q outputs and a reference timing signal.

7. The circuit of claim 6, further comprising:
    a second PLL to generate the reference timing signal based on an absolute time signal.

8. The circuit of claim 1, wherein the ADC includes a sigma delta converter with fine-grain control of decimation ratio.

9. The circuit of claim 1, wherein the ADC includes a successive approximation register (SAR) ADC.

10. The circuit of claim 1, further comprising:
    an inverter to synchronize a DC power signal to the power signal based on the phase output.

11. A method to monitor a power signal, the method comprising:
    converting a power signal to a digital data signal using an ADC;
    generating, by the ADC, a data ready signal;
    counting occurrences of the data ready signal and generating a phase output associated with the power signal based on the counted occurrences;
    interpolating the counted occurrences to generate an interpolated phase output associated with the power signal based on the counted occurrences; and
    adjusting a sampling rate of the ADC to coherently sample the power signal based on the digital data signal and the counted occurrences.

12. The method of claim 11, further comprising:
    generating a cosine wave based on the count;
    multiplying the digital data signal and the cosine wave to generated a multiplied signal; and
    filtering the multiplied signal to generate a Q output associated with the power signal.

13. The method of claim 11, further comprising:
    generating a sine wave based on the count;
    multiplying the digital data signal and the sine wave to generated a multiplied signal; and
    filtering the multiplied signal to generate a D output associated with the power signal.

14. The method of claim 11, further comprising:
    generating D and Q outputs associated with the power signal;
    receiving a reference timing signal;
    generate a synchrophasor of the power signal based on the phase, D, and Q outputs and the reference timing signal,
    wherein the reference timing signal is generated based on an absolute time signal using a PLL.

15. The method of claim 10, wherein adjusting the sampling rate includes updating a decimation register of the ADC.

16. The method of claim 10, wherein adjusting the sampling rate includes modifying a conversion start time of the ADC.

17. The method of claim 10, further comprising:
    synchronizing coupling of the DC power signal with the power signal based on the phase output.

18. A synchrophasor measurement system comprising:
    a coherent sampling ADC to receive a power signal and to convert the power signal to a digital data signal and to generate a data ready signal, wherein a sampling rate of the ADC is based on a count of the data ready signal;
    a digital engine to receive the digital data signal and data ready signal and generate phase, D, and Q outputs associated with the power signal; and
    a synchrophasor generator to generate a synchrophasor output based on the phase, D, and Q outputs associated with the power signal and a reference timing signal.

19. The synchrophasor measurement system of claim 18, further comprising:
    a PLL to generate the reference timing signal based on an absolute time signal.

* * * * *